(12) United States Patent
McDonald et al.

(10) Patent No.: US 9,118,182 B2
(45) Date of Patent: Aug. 25, 2015

(54) POWER CURVE CORRELATION SYSTEM

(75) Inventors: Jason Louis McDonald, Melbourne, FL (US); William Michael Alderson, Palm Bay, FL (US); Audley Grey, Palm Beach Gardens, FL (US)

(73) Assignee: General Electric Company, Schenectady, NY (US)

( * ) Notice: Subject to any disclaimer, the term of this patent is extended or adjusted under 35 U.S.C. 154(b) by 680 days.

(21) Appl. No.: 13/343,074

(22) Filed: Jan. 4, 2012

(65) Prior Publication Data

US 2013/0173191 A1    Jul. 4, 2013

(51) Int. Cl.
*G01R 21/00* (2006.01)
*H02J 3/00* (2006.01)
*G06Q 30/02* (2012.01)
*G06Q 50/06* (2012.01)
G01R 19/00 (2006.01)
G01R 31/26 (2014.01)
G01R 1/20 (2006.01)

(52) U.S. Cl.
CPC .............. *H02J 3/00* (2013.01); *G06Q 30/0202* (2013.01); *G06Q 50/06* (2013.01); *G01R 1/203* (2013.01); *G01R 19/0092* (2013.01); *G01R 31/2642* (2013.01); *H02J 2003/003* (2013.01); *Y04S 10/54* (2013.01); *Y04S 50/14* (2013.01)

(58) Field of Classification Search
CPC .... G06N 3/088; G01R 19/0092; G01R 1/203; G01R 31/2642; G06Q 30/0202; G06Q 50/06; H02J 3/00; Y04S 10/54
USPC ......................................................... 702/61
See application file for complete search history.

(56) References Cited

U.S. PATENT DOCUMENTS

| 7,991,512 | B2 | 8/2011 | Chandra et al. |
| 8,255,090 | B2 * | 8/2012 | Frader-Thompson et al. ............................ 700/295 |
| 8,560,134 | B1 * | 10/2013 | Lee ................. 700/291 |
| 2004/0257059 | A1 * | 12/2004 | Mansingh et al. ......... 324/76.11 |
| 2009/0045804 | A1 * | 2/2009 | Durling et al. ............. 324/140 R |
| 2010/0156178 | A1 * | 6/2010 | Holmberg ........................ 307/35 |
| 2010/0280979 | A1 * | 11/2010 | Raaijmakers .................... 706/12 |
| 2010/0328314 | A1 * | 12/2010 | Ellingham et al. ............. 345/440 |
| 2013/0138651 | A1 * | 5/2013 | Lu et al. ......................... 707/737 |
| 2014/0195138 | A1 * | 7/2014 | Stelzig et al. .................. 701/119 |

OTHER PUBLICATIONS

Mandal et al., "several hours ahead electricity price and load forcasting using neural networks", Jun. 2005, pp. 1-8.*

* cited by examiner

*Primary Examiner* — John Breene
*Assistant Examiner* — Eyob Hagos
(74) *Attorney, Agent, or Firm* — Sutherland Asbill & Brennan LLP

(57) ABSTRACT

A power curve correlation system is disclosed. The power curve correlation system includes a system including: at least one computing device configured to verify a forecast of a power network load for a component by performing actions including: obtaining a set of load data for the component in the power network over a period; identifying similar load patterns in the set of load data using a pattern recognition technique, independent of at least one of: a scale for a component load, a minimum component load value or a maximum component load value; grouping the identified similar load patterns into distinct groups; categorizing at least one of the distinct groups according to a recurring event associated with a load pattern in the at least one distinct group; and providing the categorized group for verifying the forecast of the power network load for the component using the at least one categorized group.

16 Claims, 6 Drawing Sheets

POWER CURVE CORRELATION SYSTEM

BACKGROUND OF THE INVENTION

The subject matter disclosed herein relates generally to a power curve correlation system. Specifically, the subject matter disclosed herein relates to a system for correlating and organizing the load data of a power supply system (e.g., power grid, smart grid, etc.), to provide more accurate load forecast models.

Load forecast models aid power supply companies in maintaining proper operation and accurately anticipating future power demands. More specifically, load forecast models can provide anticipated power usages for given times of day, year, etc., that are provided by a power supply system. Power supply companies rely on forecasting models to determine whether anticipatory measures are necessary in order to maintain a power supply to users. Generally, power system engineers (PSE) verify the accuracy of conventional load forecast models by reviewing large amounts of historical load data and comparing the historical data to the conventionally created load forecast models. The power system engineers must completely understand the historical load data in order to verify the accuracy of the load forecast model. As a result, the power system engineers spend much of their time reviewing the load forecast model and comparing the historical load data and the forecasting results. These large data quantities and extensive review times may lead to the development and persistence of inaccuracies in the conventional load forecast models. More specifically, the power system engineer does not have sufficient time to correlate, categorize and understand the large amount of historical data prior to verifying the accuracy of the load forecast models. If all of the historical data is not correlated, categorized and understood, inaccuracies in the load forecast model will not be identified, and the load forecast model will be defective. When a defective load forecast model does not accurately predict a necessary power network load, the power network's load supply is inadequate and will result in a power network problem (e.g., failure, power outages, etc.). Power supply companies rely on load forecasting models to accurately predict the necessary power network loads in order to avoid power network problems.

BRIEF DESCRIPTION OF THE INVENTION

A power curve correlation system is disclosed. In one embodiment, the power curve correlation system includes a system including: at least one computing device configured to verify a forecast of a power network load for a component by performing actions including: obtaining a set of load data for the component in the power network over a period; identifying similar load patterns in the set of load data using a pattern recognition technique, independent of at least one of: a scale for a component load, a predetermined minimum component load value or a predetermined maximum component load value; grouping the identified similar load patterns into distinct groups based upon the identified similar load patterns in the set of load data; categorizing at least one of the distinct groups according to a recurring event associated with a load pattern in the at least one distinct group; and providing the at least one categorized group for verifying the forecast of the power network load.

A first aspect of the invention includes a system including: at least one computing device configured to verify a forecast of a power network load for a component by performing actions including: obtaining a set of load data for the component in the power network over a period; identifying similar load patterns in the set of load data using a pattern recognition technique, independent of at least one of: a scale for a component load, a predetermined minimum component load value or a predetermined maximum component load value; grouping the identified similar load patterns into distinct groups based upon the identified similar load patterns in the set of load data; categorizing at least one of the distinct groups according to a recurring event associated with a load pattern in the at least one distinct group; and providing the at least one categorized group for verifying the forecast of the power network load.

A second aspect of the invention includes a program product stored on a non-transitory computer readable medium for verifying a forecast of a power network load for a component, the computer readable medium including program code for causing the computer system to: obtain a set of load data for the component in the power network over a period; identify similar load patterns in the set of load data using a pattern recognition technique, independent of at least one of: a scale for a component load, a predetermined minimum component load value or a predetermined maximum component load value; group the identified similar load patterns into distinct groups based upon the identified similar load patterns in the set of load data; categorize at least one of the distinct groups according to a recurring event associated with a load pattern in the at least one distinct group; and provide the at least one categorized group for verifying the forecast of the power network load.

A third aspect of the invention includes a system including: a human machine interface (HMI) operably connected to a power network; and at least one computing device operably connected to the HMI, the at least one computing device configured to verify a forecast of a power network load for a component by performing actions including: obtaining a set of load data for the component in the power network over a period; identifying similar load patterns in the set of load data using a pattern recognition technique, independent of at least one of: a scale for a component load, a predetermined minimum component load value or a predetermined maximum component load value; grouping the identified similar load patterns into distinct groups based upon the identified similar load patterns in the set of load data; categorizing at least one of the distinct groups according to a recurring event associated with a load pattern in the at least one distinct group; and providing the at least one categorized group for verifying the forecast of the power network load.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
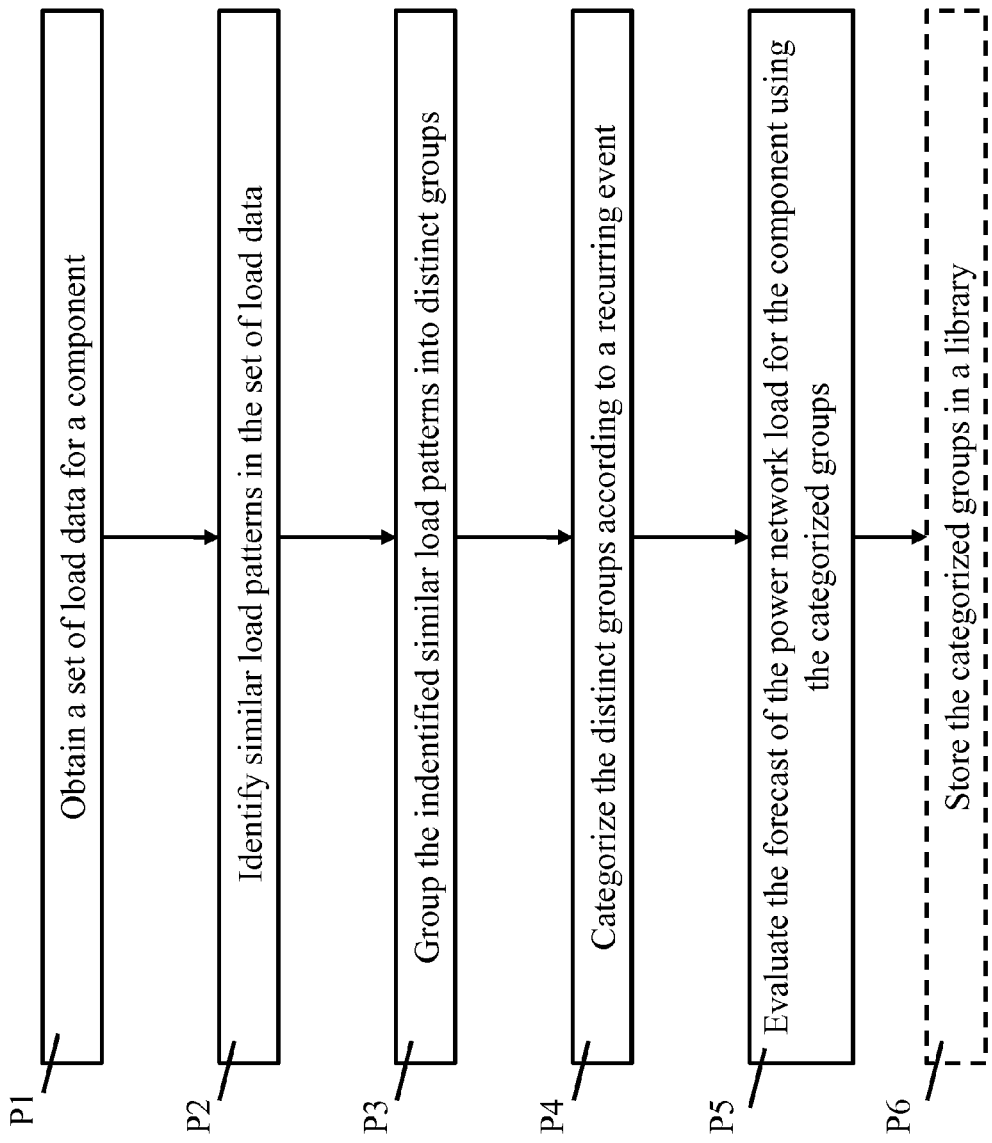
FIG. 1 shows a method flow diagram illustrating a process according to embodiments of the invention.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As described herein, aspects of the invention relate to a power curve correlation system. Specifically, as described herein, aspects of the invention relate to a system for correlating and organizing the load data of a power supply system (e.g., power grid, smart grid, etc.), to provide more accurate load forecast models.

Load forecast models aid power supply companies in maintaining proper operation and accurately anticipating future power demands. More specifically, load forecast models can provide anticipated power usages for given times of day, year, etc., that are provided by a power supply system. Power supply companies rely on forecasting models to determine whether anticipatory measures are necessary in order to maintain a power supply to users. Generally, power system engineers (PSE) verify the accuracy of conventional load forecast models by reviewing large amounts of historical load data and comparing the historical data to the conventionally created load forecast models. The power system engineers must completely understand the historical load data in order to verify the accuracy of the load forecast model. As a result, the power system engineers spend much of their time reviewing the load forecast model and comparing the historical load data and the forecasting results. These large data quantities and extensive review times may lead to the development and persistence of inaccuracies in the conventional load forecast models. More specifically, the PSE does not have sufficient time to correlate, categorize and understand the large amount of historical data prior to verifying the accuracy of the load forecast models. If all of the historical data is not correlated, categorized and understood, inaccuracies in the load forecast model will not be identified, and the load forecast model will be defective. When a defective load forecast model does not accurately predict a necessary power network load, the power network's load supply is inadequate and will result in a power network problem (e.g., failure, power outages, etc.). Power supply companies rely on load forecasting models to accurately predict the necessary power network loads in order to avoid power network problems.

In contrast to conventional approaches, aspects of the invention include a system having at least one computing device configured to verify a forecast of a power network load for a component by performing actions including: obtaining a set of load data for the component in the power network over a period and identifying similar load patterns in the set of load data using a pattern recognition technique, independent of at least one of: a scale for a component load, a predetermined minimum component load value or a predetermined maximum component load value. The computing device can also be configured to perform actions including: grouping the identified similar load patterns into distinct groups based upon the identified similar load patterns in the set of load data, categorizing at least one of the distinct groups according to a recurring event associated with a load pattern in the at least one distinct group, and providing the at least one categorized group for verifying the forecast of the power network load.

Turning to FIG. 1, a method flow diagram illustrating processes in forecasting a power network load for a component is shown according to embodiments of the invention. The process flow illustrated in FIG. 1 will be referred to in conjunction with FIGS. 2-6, and in particular, FIG. 6, which illustrates an environment for performing the actions described with reference to the process flow of FIG. 1. Reference to elements and corresponding numerals is provided for clarity of cross-reference between figures.

Figure 2:
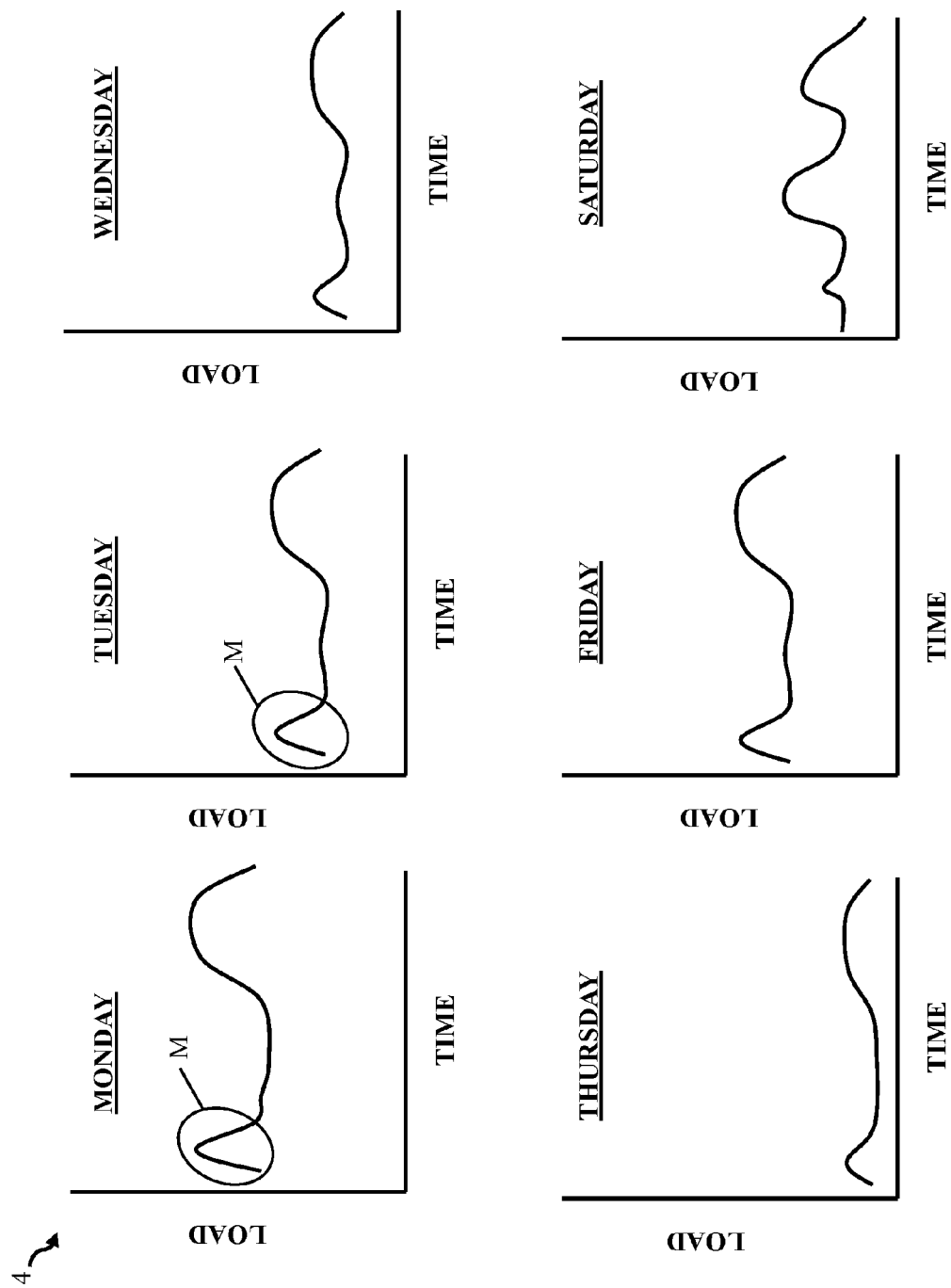
FIGS. 2-5 show linear graphs illustrating load data according to embodiments of the invention.
Figure 6:
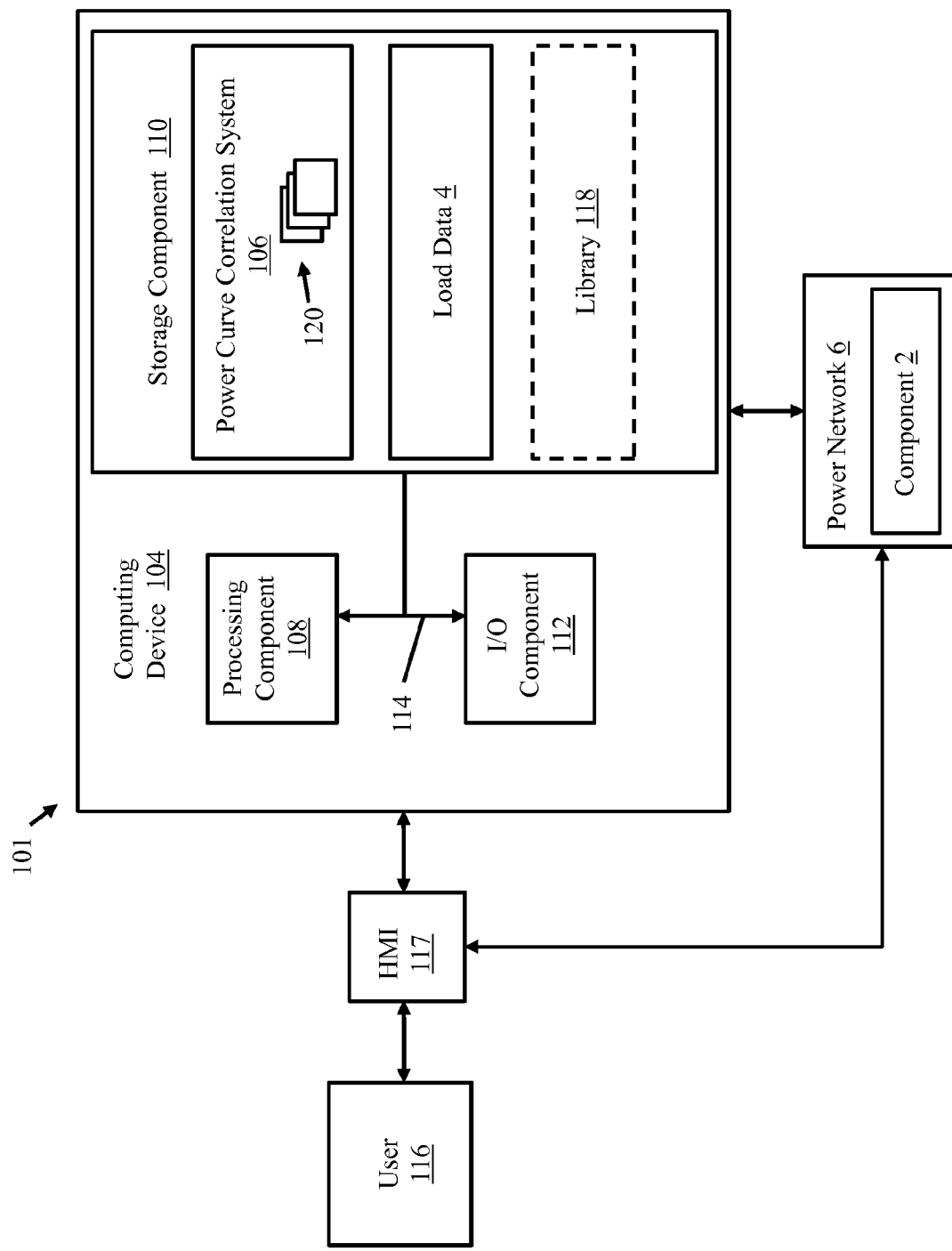
FIG. 6 shows an environment including a power curve correlation system according to embodiments of the invention.

Returning to FIG. 1, and with additional reference to FIG. 6, process P1 can include obtaining a set of load data 4 (FIGS. 2 and 6) for the component 2 connected to the power network 6 (FIG. 6) over a period. The set of load data 4 can include previously obtained loads for component 2, or as referred to below, historical load data 4. The set of historical load data 4 can be obtained by a computing device 104 (FIG. 6). More specifically, historical load data 4 for component 2 is collected from power network 6 during operation, and obtained by a power curve correlation system 106 (FIG. 6) within computing device 104. In one embodiment, power curve correlation system 106 may prompt power network 6 to provide historical load data 4. In another embodiment, historical load data 4 can be transmitted to power curve correlation system 106 in real time. In an embodiment of the invention, the set of historical load data 4 includes data relating to the load of a component 2 within the power network 6 over a period. For example, the set of historical load data 4 may include data relating to a daily load of a refrigerator (e.g., component 2) connected to power network 6 over a period of a week. In another embodiment, the component 2 can be an entire home connected to power network 6. In this embodiment, set of historical load data 4 may include data relating to the load of the home connected to power network 6 over a period of time. In further embodiments, component 2 can include a variety and/or combination of conventional components within power network 6, including: one or more homes, office buildings, city business districts, recreational parks, power substations or any other conventional component connected to power network 6. In a further embodiment, historical load data 4 can include data for component 2 over different periods of time, or can include data for component 2 specific to a particular measurement device (e.g., a DC load measurement device, a conventional large-appliance load measurement device, a conventional wind turbine load measurement device, etc.). More specifically, historical load data 4 over different periods of time can include one or more of: hourly historical load data, daily historical load data, weekly historical load data, or monthly historical load data. Historical load data 4 for component 2, specific to a certain measurement device can include one or more of: historical load data from an alternative measurement device, or phase-based historical load data. An example alternative measurement device can include a conventional large-appliance load measurement device for measuring historical load data 4 for a high-load component (e.g., electric clothing dryers, electric stoves, air conditioning units, etc.). Continuing the example above and with reference to FIG. 2, the set of historical load data 4 can include data relating to the daily load of a refrigerator within power network 6, over a period of a week. As shown in FIG. 2, the set of historical load data 4 include individual load data for each day (e.g., Monday, Tuesday, Wednesday, Thursday, etc.) of the week (data for "Sunday" omitted). More specifically, the historical load data 4 of FIG. 2 shows a set of curves displaying a continuous load curve, or power curve, of the refrigerator for each day of the week. The power network 6 provides the historical load data 4 for the refrigerator to the power curve correlation system 106 of computing device 104. More specifically, power curve correlation system 106 of computing device 104 can obtain the historical load data 4 for the refrigerator by prompting the power network 6 to provide the historical load data 4.

Figure 3:
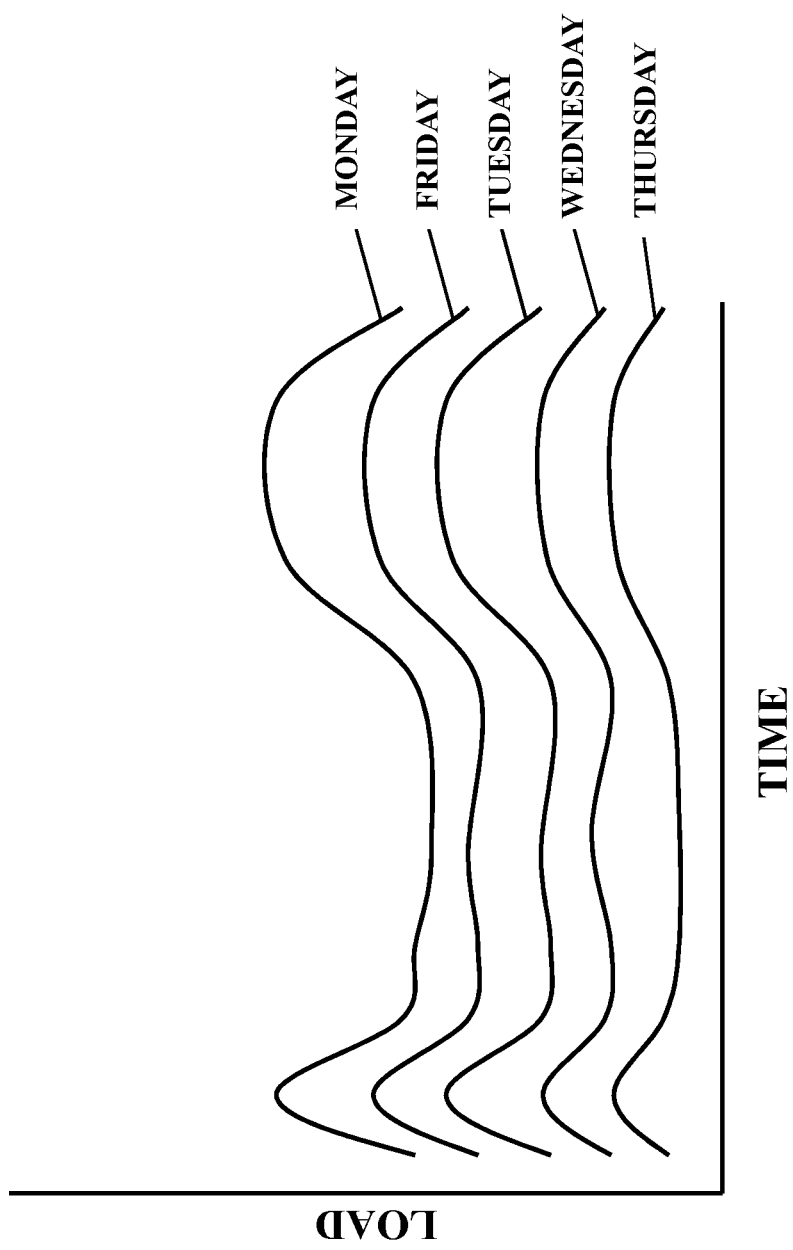

Following process P1, process P2 can include identifying similar historical load patterns in the set of historical load data 4 using a pattern recognition technique. More specifically, a pattern recognition technique compares the historical load patterns and identifies similar historical load patterns in the set of historical load data 4. In one embodiment, the pattern recognition technique identifies similar historical load patterns independent of a scale for the load for component 2. In this embodiment, the pattern recognition technique identifies similar historical load patterns based on common trends in the historical load patterns, independent of similar load values for component 2, as discussed in detail with reference to FIG. 2 below. In some embodiments, the pattern recognition technique can identify similar historical load patterns independent of one or more of: a predetermined minimum load value for component 2, or a predetermined maximum load value for component 2. The pattern recognition technique can identify similar historical load patterns by determining similarities in a graphical representation for the set of historical load data 4 for the component 2, as discussed with reference to FIG. 2 and the example of process P1 below. In some embodiments, the pattern recognition technique can identify similar historical load patterns 4 by determining one or more of: similarities in load values for component 2 over a predefined period, similarities in a sudden increase (e.g., spike) in the load for component 2, or similarities in a sudden decrease (e.g., drop) in the load for component 2. Continuing the example of process P1, in process P2 pattern recognition technique can identify similar daily historical load patterns from the set of historical load data 4 for the refrigerator. In the example, and as shown in FIG. 2, the refrigerator's daily historical load patterns can be graphically represented (e.g., set of curves) showing the daily loads of the refrigerator over a period of the week. More specifically, historical load data 4 can include historical load patterns for the refrigerator for each, individual day of the week (Sunday omitted). In the example, the pattern recognition technique compares the individual graphic representations for the daily load of the refrigerator and identifies that the refrigerator's graphic representation for daily load has a similar trend for the weekdays (e.g., Monday-Friday). More specifically, the pattern recognition technique compares the historical load patterns, as shown in FIG. 2 and identifies a similar rise in load by the refrigerator in the morning and evening hours during the weekdays. Similarly, the pattern recognition technique can identify a consistently-low load for the refrigerator during typical working hours (e.g., 8:00 AM-5:00 PM) for the weekdays. The pattern recognition technique can further identify that the load for Saturday differs from the rest of the weekdays, because there is an increase in load for the refrigerator during the midday hours (e.g., 11:00 AM-2:00 PM). Furthermore, and as mentioned above, the pattern recognition technique identifies the similar graphic representations for the load of the refrigerator independent of a load value scale for the refrigerator's load. In other words, and as illustrated in FIGS. 2 and 3, pattern recognition technique identifies that the refrigerator's historical load pattern (e.g., graphic representation for daily load) are similar for the weekdays, even though the exact load values are not identical for the refrigerator each day. Moreover, the pattern recognition technique does not limit the historical load patterns by an acceptable scale or range of load values. As such, and as shown in FIGS. 2 and 3, the pattern recognition technique will identify that the historical load pattern for Monday (highest load values) is similar to the historical load pattern for Thursday (lowest load values, even though the load values for the respective days differ.

The pattern recognition technique of process P2 can also utilize a Mean Absolute Percent Error (MAPE) function in identifying similar historical load patterns in set of historical data 4. More specifically, the MAPE function can provide a means of accuracy in identifying similar historical load patterns. The pattern recognition technique identifies similar historical load patterns by identifying similar trends (e.g., frequencies, amplitudes, oscillations, etc.) in the historical load patterns. The MAPE function allows the pattern recognition technique to determine more accurately if the historical load patterns are similar by comparing the change in load values for each of the historical load patterns and determining whether the compared changes in load values are within a predetermined accuracy range. Continuing the example of process P1, the pattern recognition technique may identify that the historical load pattern for the refrigerator on Monday is similar to the historical load pattern for the refrigerator on Tuesday. More specifically, the pattern recognition technique can identify that the graphic representation for the daily load for Monday is similar to graphic representation for the refrigerator's daily load for Tuesday. As can be seen in FIG. 2, the graphic representation for the daily load of the refrigerator for Monday and Tuesday show an increase of load during the morning hours (indicated as "M" in FIG. 2). In the example, the load value for the refrigerator on Monday may increase from 10 kWh to 13 kWh, and the load value for the refrigerator on Tuesday may increase from 8 kWh to 10 kWh. The pattern recognition technique can more accurately determine that the graphic representation for the refrigerator for Monday is similar to the graphic representation for the refrigerator on Tuesday. Utilizing the MAPE function, the pattern recognition technique can compare the change in the load values for the refrigerator on Monday and Tuesday, and determine the historical load patterns are similar. More specifically, the pattern recognition technique can determine that the historical load patterns are similar when the changes in the load values for the refrigerator do not exceed the predetermined accuracy range. For example, the MAPE function determines the accuracy range for the refrigerator to be ±5 kWh. The pattern recognition technique can then determine that the historical load patterns for Monday morning (M) and Tuesday morning (M) are similar using the MAPE function because the comparative changes in load values for the refrigerator on Monday and Tuesday morning do not exceed the accuracy range (e.g., Monday: 13−10=3 kWh, Tuesday: 10−8=2 kWh). The MAPE function provides a means for accurately determining similar historical load patterns by comparing the changes (difference) in load values, independent of determining similarities in the historical load patterns based upon the exact load value.

Following the identifying of similar historical load patterns in process P2, process P3 can include grouping the identified similar historical load patterns into distinct groups, based upon the identified similar historical load patterns in the set of historical load data 4. In an embodiment, computing device 104 can group the individual graphic representations for the load for component 2 into a single graphic representation for the similarly identified component loads for component 2 (e.g., historical load patterns). In further embodiments, computing device 104 can group similar historical load patterns represented by one or more of: similar load values for component 2 over a predefined period, similar sudden increases (e.g., spikes) in the load for component 2, or similar sudden decreases (e.g., drop) in the load for component 2. Continuing the example in process P2, and as best shown in FIG. 3, the computing device can group the similar historical load patterns for the refrigerator into a single graphic representation. More specifically, the computing device can group the similar graphic representations for the refrigerator's daily load, so each day's graphic representation (e.g., FIG. 2) is included on a single load graph, with each day identified. A power system engineer (PSE) associated with power network 6 can easily identify similar loads for the component 2 over a period of time by reviewing the grouped historical load patterns, rather than attempting to determine the similarities by reviewing the individual historical load patterns for component 2 over a period.

Figure 4:
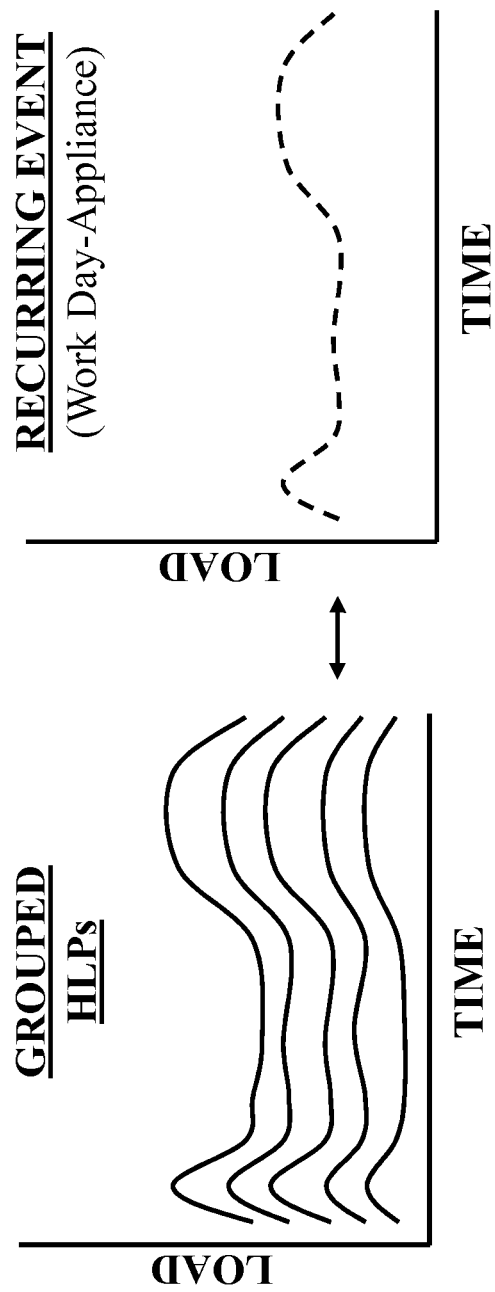
Figure 5:
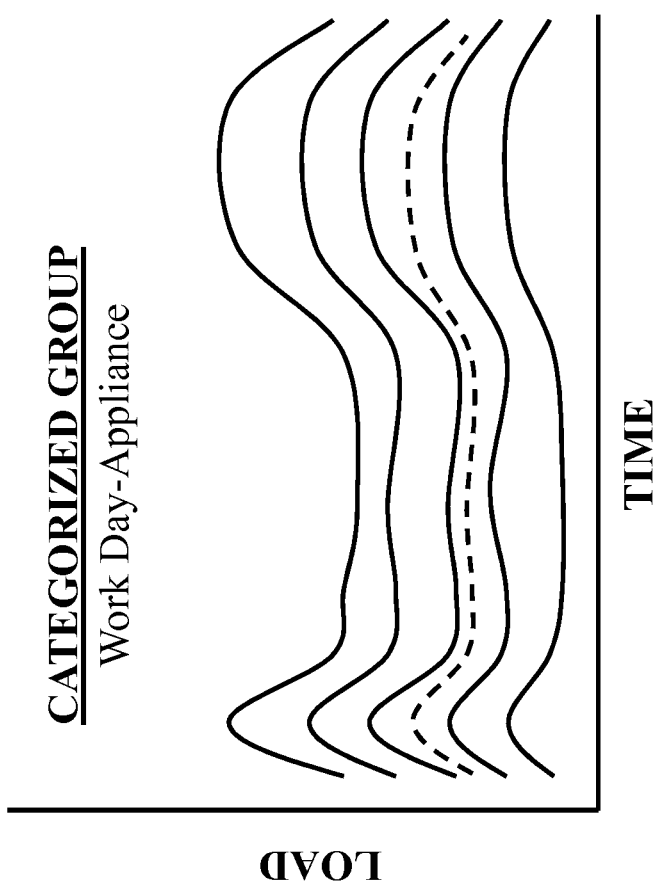

Following process P3, process P4 may include categorizing at least one of the distinct groups according to a recurring event associated with a historical load pattern in the at least one distinct group. Process P4 can include categorizing a distinct group, determined in process P3, according to one or more recurring event having a historical load pattern similar to the similar historical load pattern(s) of the distinct group. In an embodiment, the recurring event includes a power network outage event. In this embodiment, the historical load patterns associated with the power network outage event illustrates a sudden decrease in the power supplied to power network 6 for a period. Once the power is restored to the power network 6, the historical load patterns associated with the power network outage will illustrate a sudden jump in the power supplied to the power network 6. In some embodiments, recurring events can also include one or more of: demand response management system (DRMS) events, power supply maintenance events, or power usage spiking events. In an embodiment, computing device 104 can categorize the distinct group of similar historical load patterns according to a recurring event. In the embodiment, the computing device 104 can compare the historical load patterns for the distinct group to a plurality of stored historical load patterns associated with recurring events, in order to categorize the distinct group. In a further embodiment, the PSE can categorize the distinct group according to a recurring event by manually comparing the historical load patterns for the distinct group to a plurality of historical load patterns associated with recurring events. The PSE can also rely on personal knowledge of historical load patterns associated with recurring events and historical load patterns associated with specific components 2, for accurately categorizing the distinct group. The stored historical load patterns can be stored on a storage component 110 (FIG. 6) of computing device 104. Continuing the example of process P3, the grouped historical load patterns (e.g., Monday-Friday) illustrating the daily load for the refrigerator can be categorized by a recurring event that has an associated historical load pattern similar to the grouped historical load patterns. In the example, and as shown in FIG. 4, the distinct group of historical load patterns for the refrigerator is compared to a recurring event categorized as a "Work Day-Appliance" recurring event. As shown in FIG. 4, the historical load patterns for the refrigerator are similar to the historical load pattern associated with the "Work Day-Appliance" recurring event. More specifically, as shown in FIG. 4 the historical load pattern for the predetermined "Work Day-Appliance" recurring event and distinct group of historical load patterns for the refrigerator show similar increased loads in the morning/evening hours. As further shown in FIG. 5, the historical load pattern associated with the "Work Day-Appliances" and the historical load patterns for the distinct group are similar. Thus, the distinct group of historical load patterns for the daily load of the refrigerator for Monday-Friday can be categorized as a "Work Day-Appliance" recurring event.

After categorizing at least one of the distinct groups, process P5 can include providing the at least one categorized group for verifying the forecast of the power network load for the component 2 using the at least one categorized group. The categorized group can provide consistent load data for the component 2 of the power network 6, which will aid in verifying the forecast of the power network load. Verifying the forecast of the power network load using the at least one categorized group can include at least one of: verifying the accuracy of the forecast of the power network load or comparing an initial forecast with a provided categorized group and re-forecasting the power network load if the comparison indicated inaccuracies in the forecasted power network load. In some embodiments, providing the categorized group can include making the categorized group, and associated historical load data 4, available to a PSE for verifying the forecast of the power network load. In these embodiments, the categorized group and associated data can be provided to the PSE via a user interface (e.g., monitor, printer, searchable database, etc.). After the power network load is initially forecasted, a PSE can verify the accuracy of the initial forecast by comparing the initial forecast to the provided categorized groups and associated historical load data. In these embodiments, after comparing the initially forecasted power network load and the provided categorized groups, the PSE can re-forecast the power network load if the PSE determines inaccuracies in the initially forecasted power network load. The PSE can alter the algorithms used in forecasting the power network load in order to re-forecast and provide a more accurate forecast of the power network load, after verifying the initial forecast of the power network load using the provided categorized groups. In another embodiment, providing the categorized group can include making the categorized groups, and associated data, available to the power curve correlation system 106 of computing device 104 for verifying the forecast of the power network load. In this embodiment, an initially forecasted power network load can be compared to the provided categorized group(s) using the power curve correlation system 106. More specifically, the power curve correlation system 106 can compare the initially forecasted power network load to the provided categorized group(s) to verify the accuracy of the initial forecast. In this embodiment, if the power curve correlation system 106 verifies an inaccuracy in the forecast of the power network load, the power curve correlation system 106 can indicate to the PSE, via computing device 104, that the power network load must be re-forecast. In another embodiment, the categorized group can be provided to an external system or program capable of verifying the forecast of the power network load. In this embodiment, the power curve correlation system 106 can provide the external system or program with the categorized group, and associated data, for verifying the forecast. The forecasting of the power network load can be completed by the computing device 104 or any external system or program capable of forecasting a power network load known in the art. Continuing the example in process P4, historical load patterns for the categorized group ("Work Day-Appliance") are provided to the PSE via the user interface of the computing device 104. The provided "Work Day-Appliance" data allows the PSE to verify the accuracy of the forecasted power network load for the refrigerator. More specifically, the "Work Day-Appliance" historical load patterns will enable the PSE to verify the accuracy of the forecasted power network load for the refrigerator by comparing the forecast to the previous loads of the refrigerator (e.g., the provided categorized group). If the PSE verifies that the forecasted power network load for the refrigerator is inaccurate, the power network load can be re-forecasted to create a more accurate forecast based on the provided categorized group ("Work Day-Appliance"). More specifically, if the PSE verifies that the forecasted power network load for the refrigerator does not correspond to the provided "Work Day-Appliance" (e.g., differences in the compared load patterns), the PSE can re-forecast to overcome these inaccuracies. By verifying the forecast of the power network load for the refrigerator and specifically, verifying the accuracy of the forecast, the PSE can ensure the power network will be able to supply enough power, and be prepared to supply additional power if necessary, to the refrigerator in order to avoid any power network faults (e.g., power outages).

Process P6 (shown in phantom as optional) can include storing the categorized groups within a library 118 (FIG. 6, shown in phantom as optional). The stored categorized groups can be accessible for verifying an additional forecast of a future power network load for component 2. In other words, the historical load patterns associated with the categorized groups can be stored within the library 118 and utilized by the PSE in future verifications of an additionally forecasted power network load for component 2. The plurality of historical load patterns provide the PSE with more consistent historical load patterns for the component 2 when verifying the forecast of the power network load. As a result of the PSE being provided more consistent historical load patterns, verifying the accuracy of the forecast of the power network load can be improved. In some embodiments, the categorized groups can be stored in the library 118 included in storage component 110. In these embodiments, the power curve correlation system 106 can transmit the categorized group, and associated data, to the library 118 to be stored and later provided for future verifications of future forecasts of the power network load. The PSE can obtain the categorized groups, and corresponding historical load patterns, from the library 118 of computing device 104, prior to verifying the forecasted power network loads. More specifically, the stored categorized groups are provided to the PSE via a user interface of computing device 104, as described above. In another embodiment, categorized group(s), and associated data, can be stored within the power curve correlation system 106. In this embodiment, the power curve correlation system 106 can provide the PSE with stored categorized group(s) for verifying the accuracy of future forecasted power network loads. More specifically, the power curve correlation system 106 can determine the future forecast is for a specific component 2, and can provide stored categorized group(s), and associated data, for that specific component 2 to the PSE for verifying the accuracy of the forecast. Continuing the example of process P5, after the forecast of the power network load is verified using the provided categorized group ("Work Day-Appliance"), the provided categorized group, and associated historical load patterns, can be stored in the power curve correlation system 106. In a future verification of the forecasted power network load for the refrigerator, the power curve correlation system 106 can provide the PSE with the "Work Day-Appliance" historical load patterns to verify the accuracy of future forecasted power network loads. The future verification of the forecasted power network load of the refrigerator will be based upon both the stored historical load patterns for the refrigerator (e.g., stored "Work Day-Appliance") and the most recently provided categorized group of historical load patterns for the refrigerator, as described in process P5.

It is understood that systems and program products described herein can be configured to perform the processes shown and described with reference to FIG. 1.

FIG. 6 depicts an illustrative environment 101 including power curve correlation system 106 according to embodiments. To this extent, the environment 101 includes a computing device 104 that can perform a process described herein in order to verify a forecast of a power network load for component 2 in power network 6. In particular, the computing device 104 is shown as including power curve correlation system 106, which makes computing device 104 operable to provide the categorized group(s) to aid in the verification of the forecasted power network load for component 2 by performing any/all of the processes described herein and implementing any/all of the embodiments described herein.

The computing device 104 is shown including a processing component 108 (e.g., one or more processors), a storage component 110 (e.g., a storage hierarchy), an input/output (I/O) component 112 (e.g., one or more I/O interfaces and/or devices), and a communications pathway 114. In general, the processing component 108 executes program code, such as the power curve correlation system 106, which is at least partially fixed in the storage component 110. While executing program code, the processing component 108 can process data, which can result in reading and/or writing transformed data from/to the storage component 110 and/or the I/O component 112 for further processing. The pathway 114 provides a communications link between each of the components in the computing device 104. The I/O component 112 can comprise one or more human I/O devices, which enable a human user 116 (e.g., power system engineer) to interact with the computing device 104 and/or one or more communications devices to enable a system user 116 to communicate with the computing device 104 using any type of communications link. In some embodiments, user 116 (e.g., power system engineer) can interact with a human-machine interface 117, which allows user 116 to communicate with power curve correlation system 106 of computing device 104. Human-machine interface 117 can include: an interactive touch screen, a graphical user display or any other conventional human-machine interface known in the art. To this extent, the power curve correlation system 106 can manage a set of interfaces (e.g., graphical user interface(s), application program interface, etc.) that enable human and/or system users 116 to interact with the power curve correlation system 106. Further, the power curve correlation system 106 can manage (e.g., store, retrieve, create, manipulate, organize, present, etc.) data in the storage component 110, such as historical load data 4 using any solution. More specifically, power curve correlation system 106 can store historical load data 4 in library 118 (shown in phantom as optional) as described in the process above.

In any event, the computing device 104 can comprise one or more general purpose computing articles of manufacture (e.g., computing devices) capable of executing program code, such as the power curve correlation system 106, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the power curve correlation system 106 can be embodied as any combination of system software and/or application software.

Further, the power curve correlation system 106 can be implemented using a set of modules 120. In this case, a module 120 can enable the computing device 104 to perform a set of tasks used by the power curve correlation system 106, and can be separately developed and/or implemented apart from other portions of the power curve correlation system 106. As used herein, the term "component" means any configuration of hardware, with or without software, which implements the functionality described in conjunction therewith using any solution, while the term "module" means program code that enables the computing device 104 to implement the functionality described in conjunction therewith using any solution. When fixed in a storage component 110 of a computing device 104 that includes a processing component 108, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computing device 104.

When the computing device 104 comprises multiple computing devices, each computing device may have only a portion of power curve correlation system 106 fixed thereon (e.g., one or more modules 120). However, it is understood that the computing device 104 and power curve correlation system 106 are only representative of various possible equivalent computer systems that may perform a process described herein. To this extent, in other embodiments, the functionality provided by the computing device 104 and power curve correlation system 106 can be at least partially implemented by one or more computing devices that include any combination of general and/or specific purpose hardware with or without program code. In each embodiment, the hardware and program code, if included, can be created using standard engineering and programming techniques, respectively.

Regardless, when the computing device 104 includes multiple computing devices, the computing devices can communicate over any type of communications link. Further, while performing a process described herein, the computing device 104 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computing device 104 can obtain or provide data, such as historical load data 4 using any solution. For example, the computing device 104 can generate and/or be used to store historical load data 4, retrieve historical load data 4, from one or more data stores, receive historical load data 4, from another system, send historical load data 4 to another system, etc.

While shown and described herein as a system for verifying a forecast of a power network load for component 2 in power network 6, it is understood that aspects of the invention further provide various alternative embodiments. For example, in one embodiment, the invention provides a computer program fixed in at least one computer-readable medium, which when executed, enables a computer system to verify a forecast of a power network load for component 2. To this extent, the computer-readable medium includes program code, such as the power curve correlation system 106 (FIG. 6), which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a system for verifying a forecast of a power network load for a component 2 within the power network 6. In this case, a computer system, such as the computing device 104 (FIG. 6), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

Technical effects of the invention, include, but are not limited to correlating and organizing load data of a power supply system to provide more accurate load forecast models, as well as, identifying, grouping and categorizing load data to provide more accurate load forecast.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system comprising:
at least one computing device configured to verify a forecast of a power network load for a component of the power network by performing actions including:
prompting the power network to provide load data for the component of the power network;
obtaining, from the power network during operation, a set of load data for the component in the power network over a period;
identifying similar load patterns in the set of load data using a pattern recognition technique, independent of at least one of: a scale for a component load, a predetermined minimum component load value or a predetermined maximum component load value, the identifying comprising:
identifying similar historic load patterns in a set of historic load data;

comparing the identified similar load patterns to the identified similar historic load patterns; and determining, using a mean absolute percent error (MAPE) function and based on comparing the identified similar load patterns to the identified similar historic load pattern, that the identified similar load patterns are similar to the identified similar historic load patterns within a predetermined accuracy range;

grouping the identified similar load patterns into distinct groups based upon the identified similar load patterns in the set of load data, wherein the distinct groups are represented by at least one of: similar load values for the component over a predefined period, similar sudden increases in the load patterns for the component, or similar sudden decreases in the load patterns for the component;

categorizing at least one of the distinct groups according to a recurring event associated with having a load pattern similar to a load pattern of the at least one distinct group;

providing the at least one categorized group for verifying the forecast of the power network load for the component using the at least one categorized group, the providing comprising:

providing the at least one categorized group and the set of load data to an interface;

transmitting the at least one categorized group and the set of load data to a library of the at least one computing device; and storing the at least one categorized group and the set of load data in the library of the at least one computing device;

verifying the accuracy of the forecast of the power network load by comparing an initial forecast with a provided categorized group; and reforecasting the power network load in response to inaccuracies in the forecast, wherein the reforecasting includes altering algorithms used in forecasting the power network load.

2. The system of claim 1, wherein the set of load data includes at least one of: hourly load data, daily load data, weekly load data, monthly load data, alternative measurement device load data, or phase based load data.

3. The system of claim 1, wherein the at least one computing device further performing actions including:

storing the categorized groups within a library, the stored categorized groups accessible for verifying an additional forecast of a future power network load for the component.

4. The system of claim 1, wherein the recurring event includes at least one of: a demand response management system (DRMS) event, a power supply system maintenance event, a power supply system outage event, or a power usage spiking event.

5. The system of claim 1, wherein the pattern recognition technique identifies the similar load patterns by identifying at least one of: similarities in the component load values over a predefine period, similarities in a graphic representation of the load patterns, similarities in spikes in the component load, or similarities in drops in the component load.

6. A program product stored on a non-transitory computer readable medium for verifying a forecast of a power network load for a component, the computer readable medium comprising program code for causing the computer system to:

prompt the power network to provide load data for the component of the power network;

obtain, from the power network during operation, a set of load data for the component in the power network over a period;

identify similar load patterns in the set of load data using a pattern recognition technique, independent of at least one of: a scale for a component load, a predetermined minimum component load value or a predetermined maximum component load value, the identifying comprising:

identifying similar historic load patterns in a set of historic load data comparing the identified similar load patterns to the identified similar historic load patterns; and determining, using a mean absolute percent error (MAPE) function and based on comparing the identified similar load patterns to the identified similar historic load pattern, that the identified similar load patterns are similar to the identified similar historic load patterns within a predetermined accuracy range;

group the identified similar load patterns into distinct groups based upon the identified similar load patterns in the set of load data, wherein the distinct groups are represented by at least one of: similar load values for the component over a predefined period, similar sudden increases in the load patterns for the component, or similar sudden decreases in the load patterns for the component;

categorize at least one of the distinct groups according to a recurring event having associated with a load pattern similar to a load pattern of the at least one distinct group;

provide the at least one categorized group for verifying the forecast of the power network load for the component using the at least one categorized group, the providing comprising:

providing the at least one categorized group and the set of load data to an interface;

transmitting the at least one categorized group and the set of load data to a library of the at least one computing device; and storing the at least one categorized group and the set of load data in the library of the at least one computing device;

verifying the accuracy of the forecast of the power network load by comparing an initial forecast with a provided categorized group; and reforecasting the power network load in response to inaccuracies in the forecast, wherein the reforecasting includes altering algorithms used in forecasting the power network load.

7. The program product of claim 6, wherein the set of load data includes at least one of: hourly load data, daily load data, weekly load data, monthly load data, alternative measurement device load data, or phase based load data.

8. The program product of claim 6, further comprises program code for causing the computer system to:

store the categorized groups within a library, the stored categorized groups accessible for verifying an additional forecast of a future power network load for the component.

9. The program product of claim 6, wherein the recurring event includes at least one of: a demand response management system (DRMS) event, a power supply system maintenance event, a power supply system outage event, or a power usage spiking event.

10. The program product of claim 6, wherein the pattern recognition technique identifies the similar load patterns by identifying at least one of: similarities in the component load values over a predefined period, similarities in a graphic representation of the load patterns, similarities in spikes in the component load, or similarities in drops in the component load.

11. A system comprising:
a human machine interface (HMI) operably connected to a power network; and
at least one computing device operably connected to the HMI, the at least one computing device configured to verify a forecast of a power network load for a component of the power network by performing actions including:
prompting the power network to provide load data for the component of the power network;
obtaining, from the power network during operation, a set of load data for the component in the power network over a period;
identifying similar load patterns in the set of load data using a pattern recognition technique, independent of at least one of: a scale for a component load, a predetermined minimum component load value or a predetermined maximum component load value, the identifying comprising:
identifying similar historic load patterns in a set of historic load data
comparing the identified similar load patterns to the identified similar historic load patterns; and
determining, using a mean absolute percent error (MAPE) function and based on comparing the identified similar load patterns to the identified similar historic load pattern, that the identified similar load patterns are similar to the identified similar historic load patterns within a predetermined accuracy range;
grouping the identified similar load patterns into distinct groups based upon the identified similar load patterns in the set of load data, wherein the distinct groups are represented by at least one of: similar load values for the component over a predefined period, similar sudden increases in the load patterns for the component, or similar sudden decreases in the load patterns for the component;
categorizing at least one of the distinct groups according to a recurring event having associated with a load pattern similar to a load pattern of the at least one distinct group; and
providing the at least one categorized group for verifying the forecast of the power network load for the component using the at least one categorized group, the providing comprising:
providing the at least one categorized group and the set of load data to an interface;
transmitting the at least one categorized group and the set of load data to a library of the at least one computing device; and
storing the at least one categorized group and the set of load data in the library of the at least one computing device;
verifying the accuracy of the forecast of the power network load by comparing an initial forecast with a provided categorized group; and
reforecasting the power network load in response to inaccuracies in the forecast, wherein the reforecasting includes altering algorithms used in forecasting the power network load.

12. The system of claim 11, wherein the set of load data includes at least one of: hourly load data, daily load data, weekly load data, monthly load data, alternative measurement device load data, or phase based load data.

13. The system of claim 11, wherein the at least one computing device further performing actions including:
storing the categorized groups within a library, the stored categorized groups accessible for verifying an additional forecast of a future power network load for the component.

14. The system of claim 11, wherein the recurring event includes at least one of: a demand response management system (DRMS) event, a power supply system maintenance event, a power supply system outage event, or a power usage spiking event.

15. The system of claim 11, wherein the pattern recognition technique identifies the similar load patterns by identifying at least one of: similarities in the component load values over a predefined period, similarities in a graphic representation of the load patterns, similarities in spikes in the component load, or similarities in drops in the component load.

16. The system of claim 1, wherein the grouping the identified similar load patterns into distinct groups includes grouping similar graphic representations for the load patterns on a single load graph, and wherein the categorizing includes comparing the single load graph to a load graph associated with the recurring event.

* * * * *